United States Patent
Basker et al.

(10) Patent No.: US 9,548,250 B1
(45) Date of Patent: Jan. 17, 2017

(54) SEMICONDUCTOR DEVICE INCLUDING SELF-ALIGNED GATE STRUCTURE AND IMPROVED GATE SPACER TOPOGRAPHY

(71) Applicant: International Business Machines Corporation, Armonk, NY (US)

(72) Inventors: Veeraraghavan S. Basker, Schenectady, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/951,726

(22) Filed: Nov. 25, 2015

Related U.S. Application Data

(63) Continuation of application No. 14/854,590, filed on Sep. 15, 2015.

(51) Int. Cl.
*H01L 21/8238* (2006.01)
*H01L 27/092* (2006.01)
*H01L 29/66* (2006.01)

(52) U.S. Cl.
CPC .......... *H01L 21/823821* (2013.01); *H01L 21/823828* (2013.01); *H01L 21/823864* (2013.01); *H01L 21/823871* (2013.01); *H01L 21/823878* (2013.01); *H01L 27/0924* (2013.01); *H01L 29/66545* (2013.01)

(58) Field of Classification Search
CPC .......... H01L 21/823814; H01L 29/66553; H01L 27/0924; H01L 29/66795; H01L 21/823821; H01L 21/823864; H01L 21/823871
See application file for complete search history.

(56) References Cited

U.S. PATENT DOCUMENTS 6,274,499 B1 * 8/2001 Gupta ............... H01L 21/76834
257/E21.304
7,396,759 B1 * 7/2008 van Schravendijk .... H01L 21/76834
257/E21.575

(Continued)

OTHER PUBLICATIONS

Basker et al., "Semiconductor Device Including Self-Aligned Gate Structure and Improved Gate Spacer Topography", U.S. Appl. No. 14/854,590, filed Sep. 15, 2015.

(Continued)

*Primary Examiner* — Jarrett Stark
(74) *Attorney, Agent, or Firm* — Cantor Colburn LLP; Vazken Alexanian

(57) ABSTRACT

A semiconductor device includes at least one semiconductor fin on an upper surface of a semiconductor substrate, and at least one metal gate stack formed on the upper surface of the semiconductor substrate. One or more pairs of source/drain contact structures are formed on the upper surface of the semiconductor fin. Each source/drain contact structure includes a metal contact stack, a spacer, and a cap spacer. The metal contact stack is formed on the upper surface of the fin. The spacer is interposed between a contact sidewall of the metal contact stack and a gate sidewall of the at least one metal gate stack. The cap spacer is formed on an upper surface of the metal contact stack and has a cap portion disposed against the spacer such that the metal gate stack is interposed between the opposing source/drain contact structures.

10 Claims, 22 Drawing Sheets

(56) References Cited

U.S. PATENT DOCUMENTS

| | | | |
|---|---|---|---|
| 8,637,359 B2* | 1/2014 | Chang | H01L 29/66545 257/347 |
| 9,040,421 B2* | 5/2015 | Zhang | H01L 21/76843 257/E21.245 |
| 9,306,001 B1* | 4/2016 | Cai | H01L 29/0638 |
| 2006/0084232 A1* | 4/2006 | Grupp | H01L 29/0895 438/291 |
| 2006/0175669 A1* | 8/2006 | Kim | H01L 29/4908 257/401 |
| 2006/0202266 A1* | 9/2006 | Radosavljevic | H01L 23/485 257/344 |
| 2006/0292765 A1* | 12/2006 | Blanchard | B82Y 10/00 438/157 |
| 2008/0308942 A1* | 12/2008 | Chanda | H01L 21/76834 257/761 |
| 2010/0330808 A1* | 12/2010 | Richter | H01L 21/823807 438/691 |
| 2011/0159654 A1* | 6/2011 | Kronholz | H01L 21/28123 438/283 |
| 2012/0080661 A1* | 4/2012 | Saito | H01L 21/76876 257/29 |
| 2012/0139053 A1* | 6/2012 | Ando | H01L 21/823842 257/369 |
| 2013/0049091 A1* | 2/2013 | Saino | H01L 21/823842 257/310 |
| 2013/0069199 A1* | 3/2013 | Adkisson | H01L 28/90 257/532 |
| 2013/0187229 A1* | 7/2013 | Cheng | H01L 29/772 257/347 |
| 2013/0200454 A1* | 8/2013 | Anderson | H01L 29/66545 257/347 |
| 2013/0270628 A1* | 10/2013 | Huang | H01L 29/0847 257/329 |
| 2014/0103414 A1* | 4/2014 | Koldiaev | H01L 21/845 257/296 |
| 2014/0154846 A1* | 6/2014 | Cheng | H01L 29/66772 438/151 |
| 2015/0041909 A1* | 2/2015 | Bouche | H01L 21/823828 257/369 |
| 2015/0214113 A1* | 7/2015 | Bouche | H01L 21/823431 438/283 |
| 2015/0243760 A1* | 8/2015 | He | H01L 29/66545 257/288 |
| 2015/0270373 A1* | 9/2015 | Horak | H01L 29/66545 257/401 |
| 2016/0086805 A1* | 3/2016 | Xu | H01L 21/28079 257/402 |

OTHER PUBLICATIONS

List of IBM Patents or Patent Applications Treated as Related; (Appendix P), Filed Feb. 3, 2016; 2 pages.

* cited by examiner

SEMICONDUCTOR DEVICE INCLUDING SELF-ALIGNED GATE STRUCTURE AND IMPROVED GATE SPACER TOPOGRAPHY

DOMESTIC PRIORITY

This application is a continuation of U.S. patent application Ser. No. 14/854,590, filed Sep. 15, 2015, the disclosure of which is incorporated by reference herein in its entirety.

BACKGROUND

The present invention relates to semiconductor devices, and more specifically, to three-dimensional (3D) semiconductor devices.

Field effect transistors (FETs) are widely used in the electronics industry for switching, amplification, filtering, and other tasks related to both analog and digital electrical signals. Most common among these are metal-oxide-semiconductor field-effect transistors (MOSFET), in which a gate structure is energized to create an electric field in an underlying channel region of a semiconductor body, by which electrons are allowed to travel through the channel between a source region and a drain region of the semiconductor body. Complementary metal-oxide-semiconductor field-effect transistor, which are typically referred to as CMOS devices, have become widely used in the semiconductor industry. These CMOS devices include both n-type and p-type (NMOS and PMOS) transistors, that promote the fabrication of logic and various other integrated circuitry.

The escalating demands for high density and performance associated with ultra large scale integrated (ULSI) circuit devices have let to certain design features, such as shrinking gate lengths, high reliability and increased manufacturing throughput. The continued reduction of design features has challenged the limitations of conventional fabrication techniques. Three-dimensional semiconductor devices, such as fin-type semiconductor devices (referred to as finFETs), typically include dielectric gate spacers formed on sidewalls of the gate stack to isolate the gate stack from the adjacent source/drain (S/D) regions.

The continued demand to scale down the size of finFET devices has resulted in forming semiconductor fins with reduced fin pitches.

SUMMARY

According to an embodiment, a method of forming a semiconductor device comprise forming at least one semiconductor fin on an upper surface of a semiconductor substrate, and forming a dielectric layer having at least one sacrificial dielectric portion on an upper surface of the at least one semiconductor fin. The method further comprises forming a first source/drain metal contact stack adjacent a first side of the sacrificial dielectric portion and a second source/drain metal contact stack adjacent a second side of the sacrificial dielectric portion. After forming the first and second source/drain metal contact stacks, the sacrificial dielectric portion is replaced with a metal gate stack to form a semiconductor device having self-aligned contacts.

According to another embodiment, a method of forming self-aligned source/drain contacts of a complementary metal oxide semiconductor (CMOS) device comprises forming at least one semiconductor fin on an upper surface of a semiconductor substrate, and patterning a dielectric layer disposed atop the at least one semiconductor fin. The patterned dielectric layer defines a first plurality of contact trenches exposing a first sacrificial dielectric portion on a first region of the at least one semiconductor fin reserved for an NFET device, and a second plurality of contact trenches exposing a second sacrificial dielectric portion on a second region of the at least one semiconductor fin reserved for a PFET device. The method further includes depositing a conformal spacer layer that lines the upper surface of the dielectric layer and the surfaces of the first and second plurality of contact trenches. A first portion of the conformal spacer layer located in the first region is patterned so as to form NFET spacers on sidewalls of the first plurality of contact trenches while preserving a second portion of the conformal spacer layer located in the second region. The method further includes selectively patterning the second portion of the conformal spacer layer located in the second region so as to form PFET spacers on sidewalls of the second plurality of contact trenches while preserving the NFET spacers. The method further includes forming in-situ doped NFET epitaxial conductive material followed by NFET source/drain metal contact stacks between the NFET spacers formed in the first plurality of contact trenches and in-situ doped PFET epitaxial conductive material followed by PFET source/drain metal contact stacks between the PFET spacers formed in the second plurality of contact trenches so as to form the self-aligned contacts.

According to still another embodiment, a semiconductor device includes at least one semiconductor fin on an upper surface of a semiconductor substrate. At least one metal gate stack is formed on the upper surface of the semiconductor substrate, and at least one pair of opposing source/drain contact structures is formed on the upper surface of the semiconductor fin. Each source/drain contact structure includes an in-situ doped epitaxial conductive material, a metal contact stack, one or more spacers, and a cap spacer. The in-situ doped epitaxial conductive material and metal contact stack is formed atop the upper surface of the at least one fin. At least one spacer is interposed between a contact sidewall of the metal contact stack and a gate sidewall of the at least one metal gate stack. The cap spacer is formed on an upper surface of the metal contact stack and has a cap portion disposed against the spacer. Accordingly, the metal gate stack is interposed between the opposing source/drain contact structures.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

FIGS. 1A-21 are a series of views illustrating a method of forming a semiconductor device according to at least one non-limiting embodiment, in which:

FIG. 1A is a cross-sectional view of an intermediate semiconductor device including a semiconductor fin formed atop a bulk semiconductor substrate, and a patterned dielectric layer formed atop to fin so as to expose portions of the fin reserved for source/drain (S/D) regions;

FIG. 2 illustrates the semiconductor device of FIG. 1B after depositing a conformal spacer layer on an upper surface of the dielectric layer and on sidewalls of contact trenches patterned in the dielectric layer;

FIG. 3 illustrates the semiconductor device of FIG. 2 following a selective directional etching process that removes a portion of the conformal spacer layer from the upper surface of the dielectric layer and the upper surface of the fin;

FIG. 4 illustrates the semiconductor device of FIG. 3 following deposition of a hardmask layer atop the dielectric layer and which fills the contact trenches;

FIG. 5 illustrates the semiconductor device of FIG. 4 including a patterned photoresist layer atop the hardmask layer so as to expose a portion of the hardmask layer located in a PFET region of the semiconductor device while covering a portion of the hardmask layer located in an NFET region of the semiconductor device;

FIG. 6 illustrates the semiconductor device of FIG. 5 after removing the hardmask layer from the sidewalls of the spacer layer and the upper surface of the fin located in the PFET region to re-expose the contact trenches;

FIG. 7 illustrates the semiconductor device of FIG. 6 after epitaxially growing a first conductive material from portions of the semiconductor fin located in the PFET region so as to partially fill the contact trenches;

FIG. 8 illustrates the semiconductor device of FIG. 7 following deposition of a second hardmask layer that covers the first hardmask layer located in the NFET region and that covers the spacer layer and fills the contact trenches to cover the epitaxial conductive material located in the PFET region;

FIG. 9 illustrates the semiconductor device of FIG. 8 including a patterned photoresist layer atop the second hardmask layer so as to expose a portion of the second hardmask layer located in the NFET while covering the second hardmask layer located in the PFET region;

FIG. 10 illustrates the semiconductor device of FIG. 9 after removing the first and second hardmask layers from sidewalls of the spacer layer and the upper surface of the fin located in the NFET region to re-expose the contact trenches;

FIG. 11 illustrates the semiconductor device of FIG. 10 after epitaxially growing a second conductive material from portions of the semiconductor fin located in the NFET region so as to partially fill the contact trenches;

FIG. 12 illustrates the semiconductor device of FIG. 11 after removing the photoresist and second hardmask layer thereby exposing both the first and second epitaxial conductive materials within the contact trenches of the NFET region and PFET region, respectively;

FIG. 13 illustrates the semiconductor device of FIG. 12 following deposition of a contact liner on an upper surface of the dielectric layer and which conforms to sidewalls of the contact trenches and the upper surface of the first and second epitaxial conductive materials;

FIG. 14 illustrates the semiconductor device of FIG. 13 following deposition of a conductive contact material against the contact liner so as to fill the contact trenches located in the NFET regions and the PFET region;

FIG. 15 illustrates the semiconductor device of FIG. 14 following a planarization process that forms conductive contact material flush with the contact liner, spacers and dielectric layer;

FIG. 16 illustrates the semiconductor device of FIG. 15 after recessing a portion of the contact liner and conductive contact material to form gaps below a remaining portion of the spacers formed on sidewalls of the contact trenches;

FIG. 17 illustrates the semiconductor device of FIG. 16 after filling the gaps with a contact cap which covers the contact liner and the conductive contact material to form S/D metal contact stacks;

FIG. 18 illustrates the semiconductor device of claim 17, after patterning a photoresist layer deposited on an upper surface of the dielectric layer 114 so as to cover the NFET and PFET S/D contact stacks while exposing sacrificial portions of the underlying dielectric layer.

FIG. 19 illustrates the semiconductor device of FIG. 18 after selectively removing the sacrificial dielectric layers to form gate trenches between the S/D metal contact stacks;

FIG. 20 illustrates the semiconductor device of FIG. 19 following removal of the photoresist from the upper surface of the dielectric layer; and FIG. 21 illustrates the semiconductor device of FIG. 20 after forming self-aligned gate stacks in the gate trenches located in the NFET and PFET regions.

DETAILED DESCRIPTION

Various embodiments of the invention provide a semiconductor device including one or more self-aligned gate structures with an improved gate spacer topology. According to at least one embodiment, in-situ doped epitaxial conductive material and source/drain (S/D) contacts are formed prior to forming gate spacers that serve to isolate a conductive gate stack from the S/D contacts. The gate spacers are therefore exposed to a reduced number of etchings processes during the device fabrication process. In this manner, a semiconductor device is provided, which includes gate spacers having an improved topology compared to conventional semiconductor devices.

According to another embodiment, the in-situ doped epitaxial conductive material and S/D contacts stacks are completed prior to forming the gate stacks. This contact-first scheme (i.e., forming the contacts prior to forming the gate stacks) results in gate stacks that are self-aligned with the S/D contact stacks. In this manner, a semiconductor device with reduced fin pitch can be provided while still controlling the parasitic overlap capacitances between the gate stack and the S/D contact stacks.

Figure 1A:
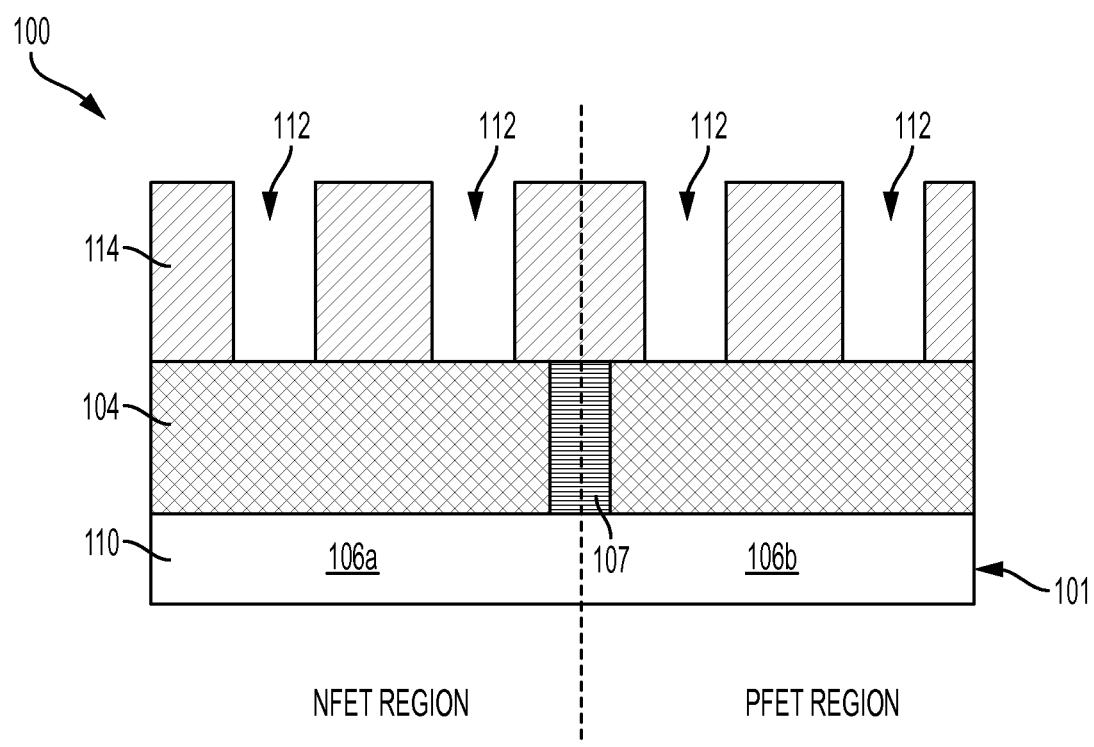
Figure 1B:
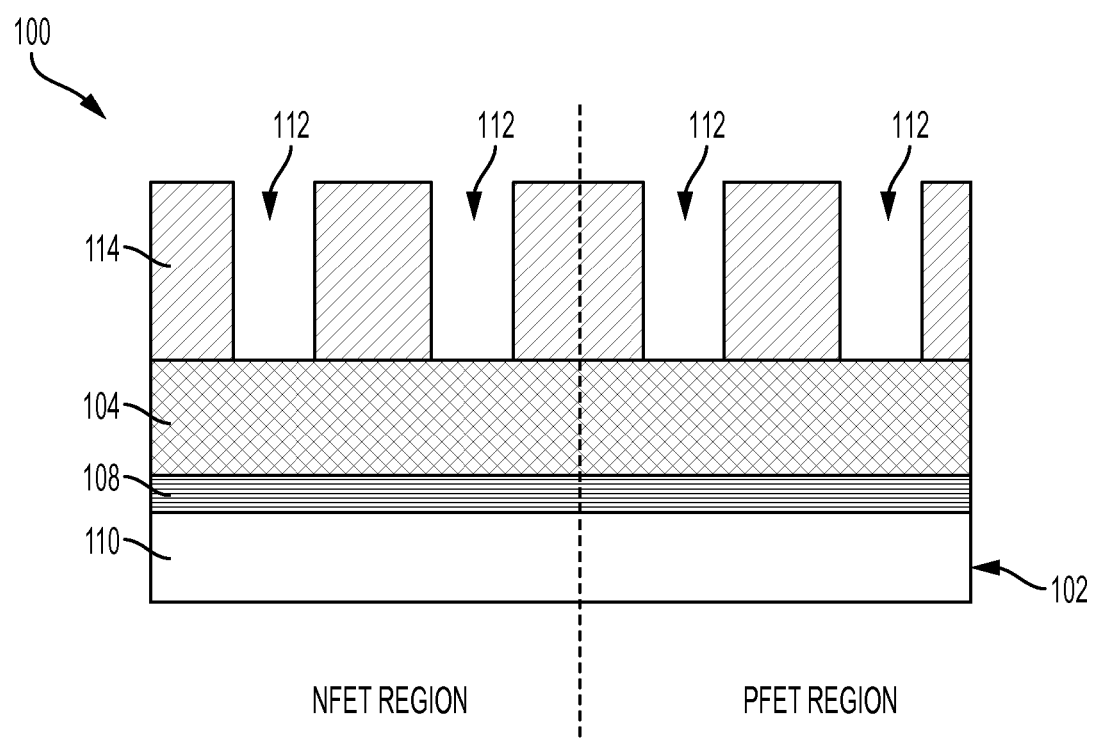
FIG. 1B is a cross-sectional view of an intermediate semiconductor device including a semiconductor fin formed atop a semiconductor-on-insulator substrate, and a patterned dielectric layer formed atop to fin so as to expose portions of the fin reserved for source/drain (S/D) regions.

Referring now to FIGS. 1A-1B, an intermediate semiconductor device 100 is illustrated according to non-limiting embodiments. The intermediate semiconductor device 100 may include a bulk substrate 101 (see FIG. 1A) or a semiconductor-on-insulator substrate 102 (see FIG. 1B) as discussed in greater detail below. In the present specification and claims, an "intermediate" semiconductor device 100 is defined as a semiconductor device in a stage of fabrication prior to a final stage.

Referring first to FIG. 1A, an intermediate semiconductor device 100 is illustrated including one or more semiconductor fins 104 formed atop a bulk substrate 101 according to a non-limiting embodiment. Different regions of the semiconductor fin 104 may be doped with different impurities, respectively. According to an embodiment, a first region 106a can be doped with a p-type material such as boron (B), for example, to form an n-type (i.e., NFET) region 106a. A second region 106b can be doped with an n-type material such as phosphorus (P), for example, to form a p-type (i.e., PFET) region 106b, as further shown in FIG. 1A. In addition, the bulk substrate 105 may include one or more shallow trench isolation (STI) regions 107 as further illustrated in FIG. 1B. The STI regions are formed in the semiconductor fin 104 to isolate the NFET region 106a and the PFET region 106b from one another. In this manner, the intermediate semiconductor device 100 can be formed with both an n-type semiconductor structure (i.e., an NFET) and a p-type semiconductor structure (i.e., a PFET) on a single substrate.

Various patterning techniques may be used to form the semiconductor fin 104. For example, a suitable hardmask blocking layer (not shown) formed of silicon dioxide ($SiO_2$), for example, can be initially deposited on an upper surface of the bulk substrate 101. Next, a suitable hardmask cap layer (not shown) formed of silicon nitride (SiN), for example, is deposited atop the hardmask blocking layer. The hardmask cap layer and the hardmask blocking layer will be used to pattern the underlying bulk substrate 101 while serving to protect the fin 104 during the formation of the isolation region 107.

Next, the hardmask blocking layer and the hardmask cap layer are etched to define the desired fin pattern. A developed photoresist mask (not shown) is typically used to define the desired fin pattern. The hardmask blocking layer and hardmask cap layer can then be patterned selective to the developed photoresist mask according to a reactive ion etch (RIE) process. The patterned hardmask layers will then be used to transfer the desired fin pattern into the underlying bulk substrate layer 101 according to a RIE process to define one or more of the semiconductor fins 104. It should be appreciated that the length and width of the patterning can be determined according to the desired fin dimensions for the particular application Referring now to FIG. 1B, an intermediate semiconductor device 100 is illustrated including one or more semiconductor fins 104 formed atop a semiconductor-on-insulator (SOI) substrate 102 according to a non-limiting embodiment. The semiconductor fin 104 may be formed according to a sidewall image transfer (SIT) process, for example, which transfers a fin pattern into an active semiconductor layer (not shown) originally included with the SOI substrate 102. As described above, the semiconductor fin 104 may include different regions doped with different impurities which serve as the basis of forming an NFET device and a PFET device. For instance, a first region 106a can be doped with a p-type material such as boron (B), for example, to form an n-type (i.e., NFET) region 106a, while a second region 106b can be doped with an n-type material such as phosphorus (P), for example, to form a p-type (i.e., PFET) region 106b, as further shown in FIG. 1B. The SOI substrate 102 will serve as the basis of the remaining fabrication operation going forward. It should be appreciated, however, that the fabrication operations described below can also be applied to the aforementioned bulk substrate 101 without departing from the scope of the invention.

Still referring to FIG. 1B, the SOI substrate 102 includes a buried insulator layer 108 interposed between a lower bulk semiconductor layer 110 and the semiconductor fin 104. The buried insulator layer 108 may include a buried oxide (BOX) layer comprising various dielectric materials including, but not limited to, silicon dioxide ($SiO_2$). The bulk semiconductor layer 110 may be formed from a various semiconductor materials including, for example, silicon (Si). As discussed above, the semiconductor fin 104 may be formed by transferring a fin pattern into an active semiconductor layer (not shown) originally formed atop the buried insulator layer 108. The active semiconductor layer may be formed of various semiconductor materials including Si, for example. In this manner, one or more semiconductor fins 104 can be formed atop the buried insulator layer 108 as illustrated in FIG. 1.

With further reference to FIG. 1B, the intermediate semiconductor device 100 is illustrated following the formation of contact trenches 112 in a dielectric layer 114 formed atop the semiconductor fin 104. The contact trenches 112 may be formed according to a combination of masking and photolithography etching techniques as understood by one of ordinary skill in the art, for example. The contact trenches 112 expose portions of the fin 104 which are reserved for source/drain (S/D) fabricated according to the process flow described in greater detail below. In this manner, the sacrificial dielectric portion may be replaced with a metal gate stack without requiring additional process flow operations necessary to form a conventional dummy gate stack utilized by traditional replacement metal gate processes.

Figure 2:
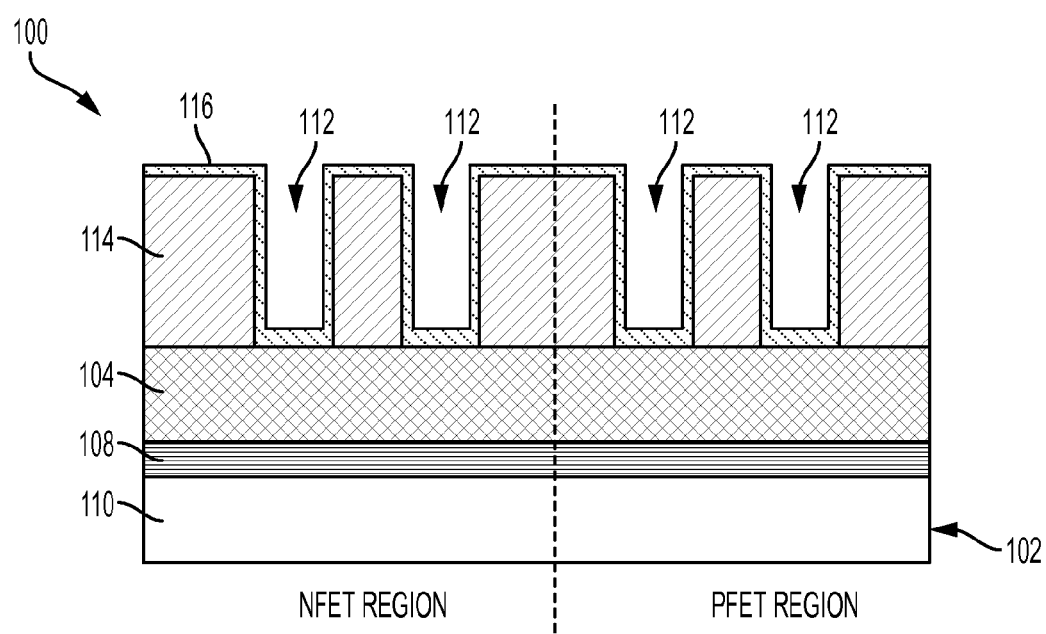

Referring now to FIG. 2, the semiconductor device 100 is illustrated after depositing a conformal spacer layer 116 on an upper surface of the dielectric layer 114 so as to conform to sidewalls defined by contact trenches 112 and the upper surface fin 104. The conformal spacer layer 116 may be deposited using a chemical vapor deposition (CVD) process, for example, and may be formed from various dielectric materials including, for example, silicon nitride (SiN). The thickness of the conformal spacer layer ranges, for example, from approximately 2 nanometers (nm) to approximately 20 nm, most preferably 6 nm.

Figure 3:
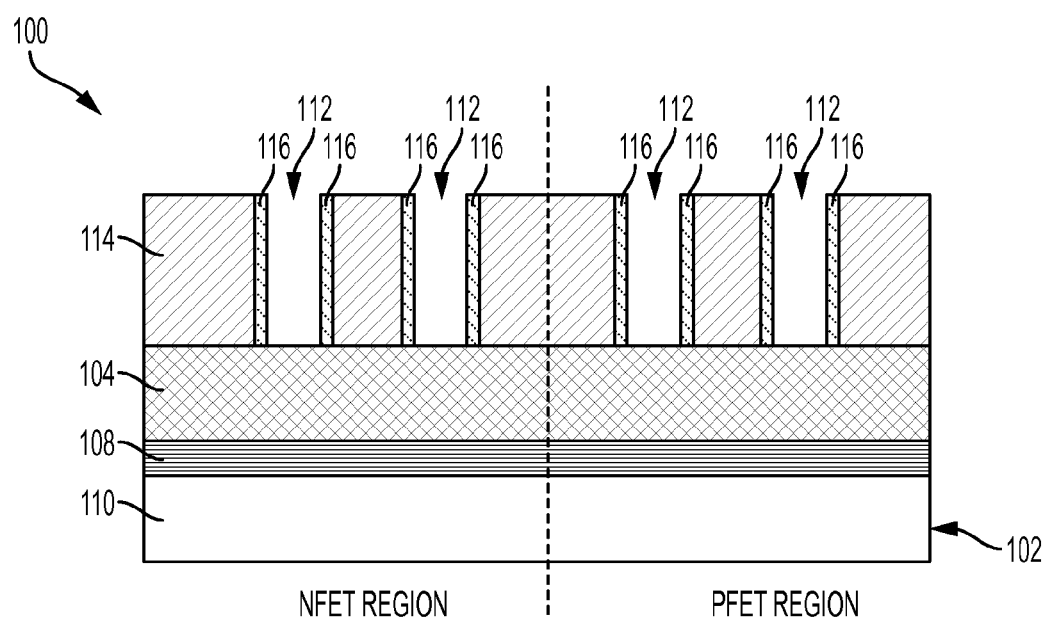

Referring to FIG. 3, a selective directional etching process is performed that removes portions of the conformal spacer layer 116. According to a non-limiting embodiment, the directional etching process includes a vertical directional reactive ion etch (RIE) selective to a semiconductor material so as to stop on the upper surface of the fin 104. In this manner, the conformal layer 116 are removed from upper surfaces of the dielectric layer 114 and the fin 104 while portions of the conformal layer are maintained on sidewalls of the dielectric material 114 defined by the contact trenches 112.

Figure 4:
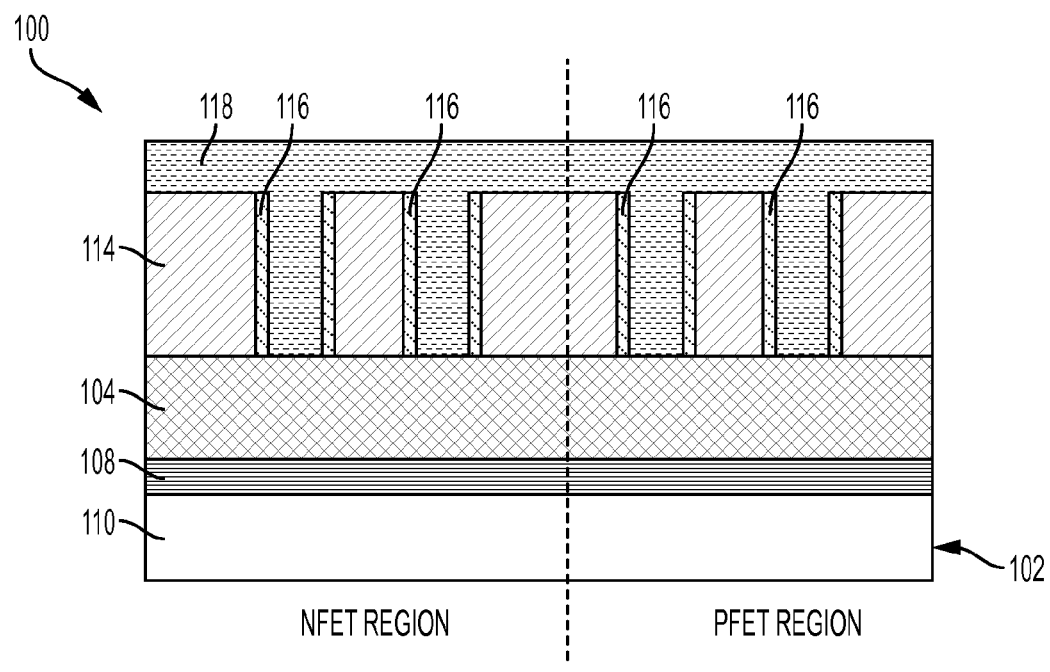

Turning to FIG. 4, the semiconductor device 100 is illustrated following deposition of a hardmask layer 118 atop the dielectric layer. The hardmask layer 118 fills the voids so as to cover the upper surfaces of the exposed fin 104. A CVD process, for example, may be performed to deposit a hardmask material so as to form the hardmask layer 118. According to a non-limiting embodiment, the material of the hardmask layer 118 is different from the material of the conformal spacer layer 116. For example, the hardmask layer 118 is formed from titanium nitride (TiN). The difference in materials satisfies a prerequisite for selectively etching the hardmask layer 118 with respect to the conformal spacer layer 116 as discussed in greater detail below.

Figure 5:
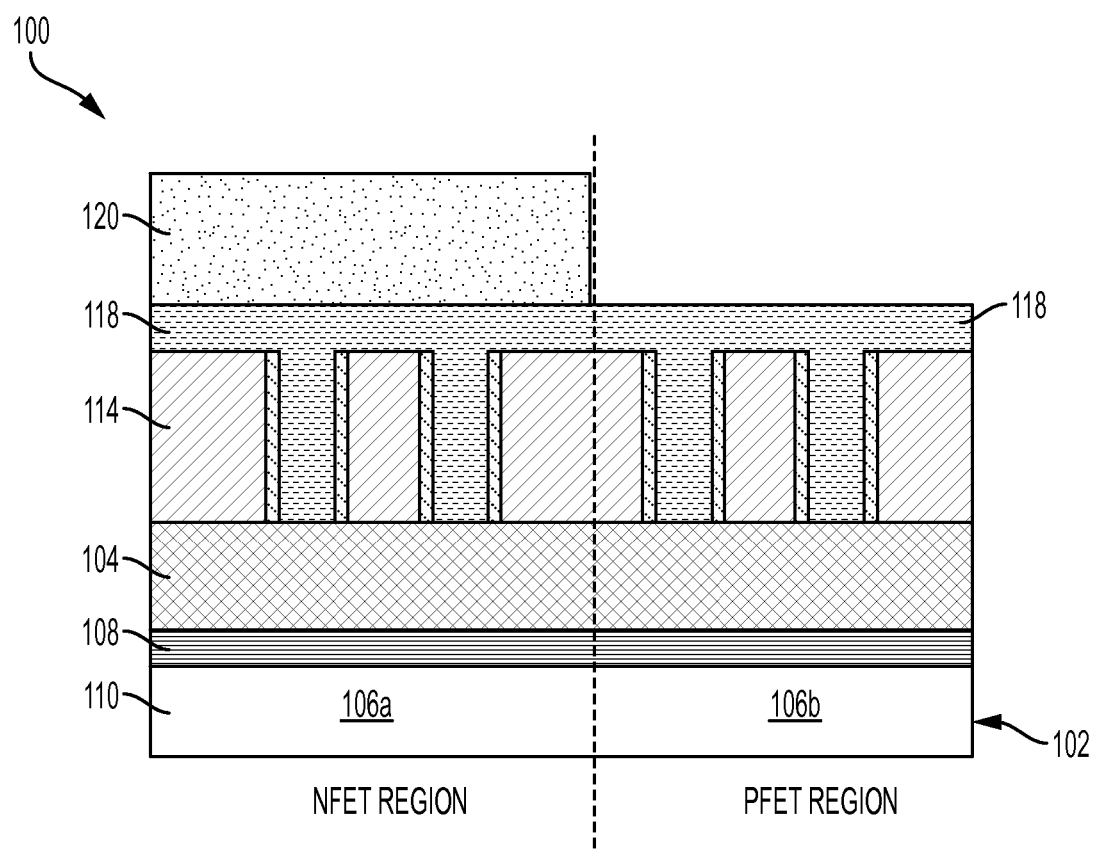

FIG. 5 illustrates the semiconductor device 100 following deposition and patterning of a photoresist layer 120 deposited on an upper surface of the hardmask layer 118. More specifically, the photoresist layer 120 is initially deposited completely on the upper surface of the hardmask layer 118. Thereafter, a patterned mask (not shown) is disposed above the photoresist layer 118. The mask has a pattern that covers a portion of the hardmask layer 118 located in the NFET region 106a and exposes a portion of the hardmask layer 118 located in the PFET region 106b.

After positioning the mask, a lithography process is preformed that exposes the device 100 to ultra violet (UV) light, for example. The photoresist material reacts with the UV light such that the pattern defined by the mask is transferred into the exposed photoresist layer 120. In this manner, a portion of the hardmask layer 118 located in the PFET region 106b is exposed while a portion of the hardmask layer located in the NFET region 106a remains covered by the non-patterned photoresist layer 120 as illustrated in FIG. 5. Although the photoresist layer 120 located in the PFET region is shown as being pattern first, it should be appreciated that the photoresist layer 120 in the NFET region can be first patterned in the same manner discussed above.

Figure 6:
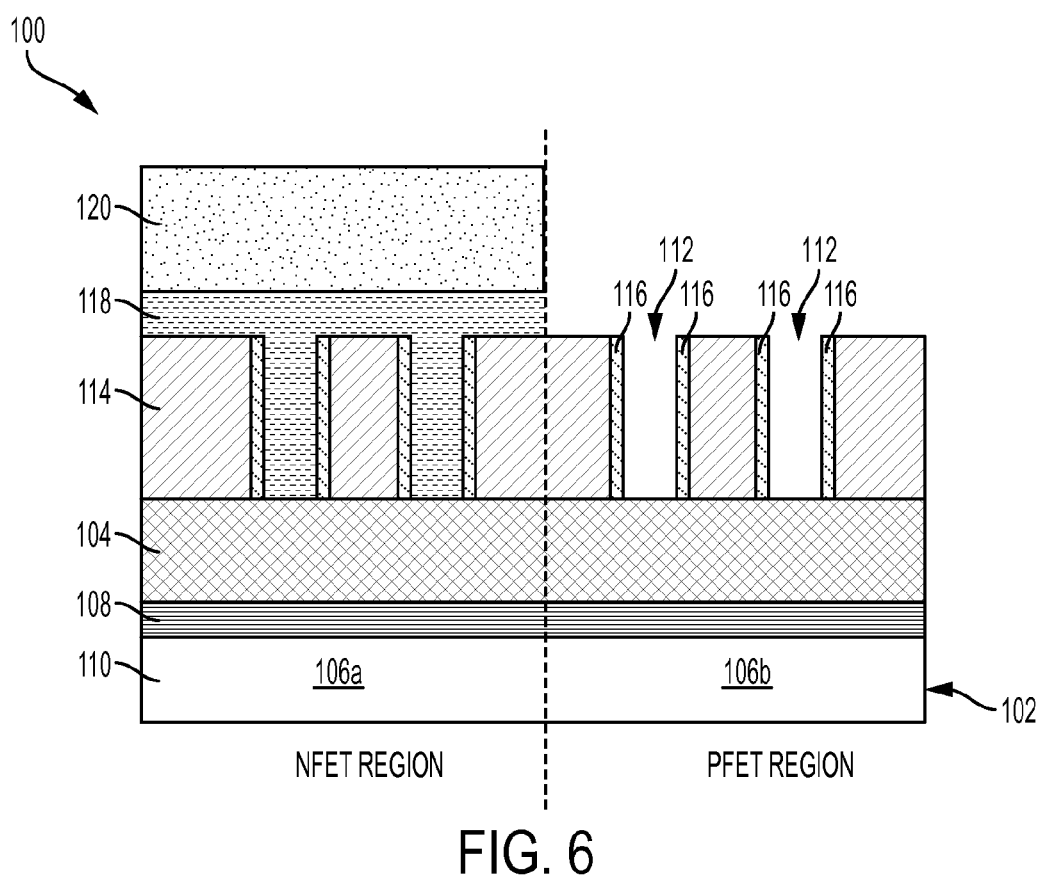

Referring to FIG. 6, a portion of the hardmask layer 118 is removed from the spacer layer and the fin located in the PFET region 106b. The contact trenches 112 formed in the dielectric layer 114 are again revealed which re-exposes a portion of the semiconductor fin 104 located in the PFET region 106b. A directional etch such as a RIE process, for example, that is selective to the dielectric layer 114, the conformal spacer material 116, and the fin 104 may be used to selectively remove the hardmask layer 118. Following the directional etch process, the hardmask layer 118 located in the NFET region 106a is maintained since it is covered by the photoresist layer 120 as further illustrated in FIG. 6.

Figure 7:
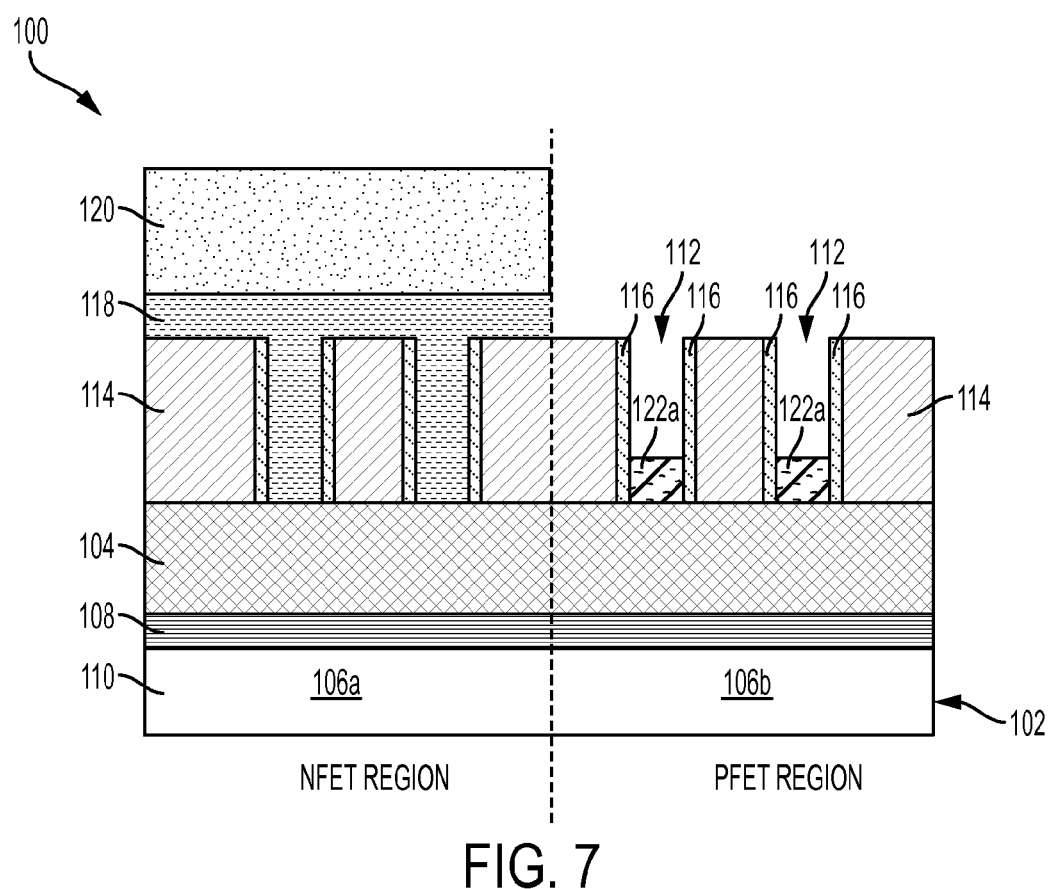

Turning now to FIG. 7, the semiconductor device 100 is shown following removal of the remaining photoresist (indicated in FIG. 6 as element 120) and after partially filling the contact trenches 112 with a first conductive material 122a. The first conductive material 122a may be formed according to an epitaxial growth process to grow a grow an undoped or highly-conductive material, such as silicon (Si) or silicon germanium (SiGe), for example, from surfaces of the fin 104 exposed by the contact trenches 112. The epitaxy process used to grow the first conductive material 122a may be carried out using vapor phase epitaxy (VPE), molecular beam epitaxy (MBE) or liquid phase epitaxy (LPE) with a gaseous or liquid precursor, such as, for example, silicon tetrachloride.

According to a non-limiting embodiment, the first conductive material 122a is in-situ doped with phosphorous (P), for example, to increase the conductivity of the first conductive material 122a. According to another option, the first conductive material 122a can be implanted with phosphorous (P) ions, for example, using an ion-implantation process that is performed after the epitaxial growth process. In either case, an anneal process (not shown) can be performed to activate the dopants within the first conductive material 122a.

Figure 8:
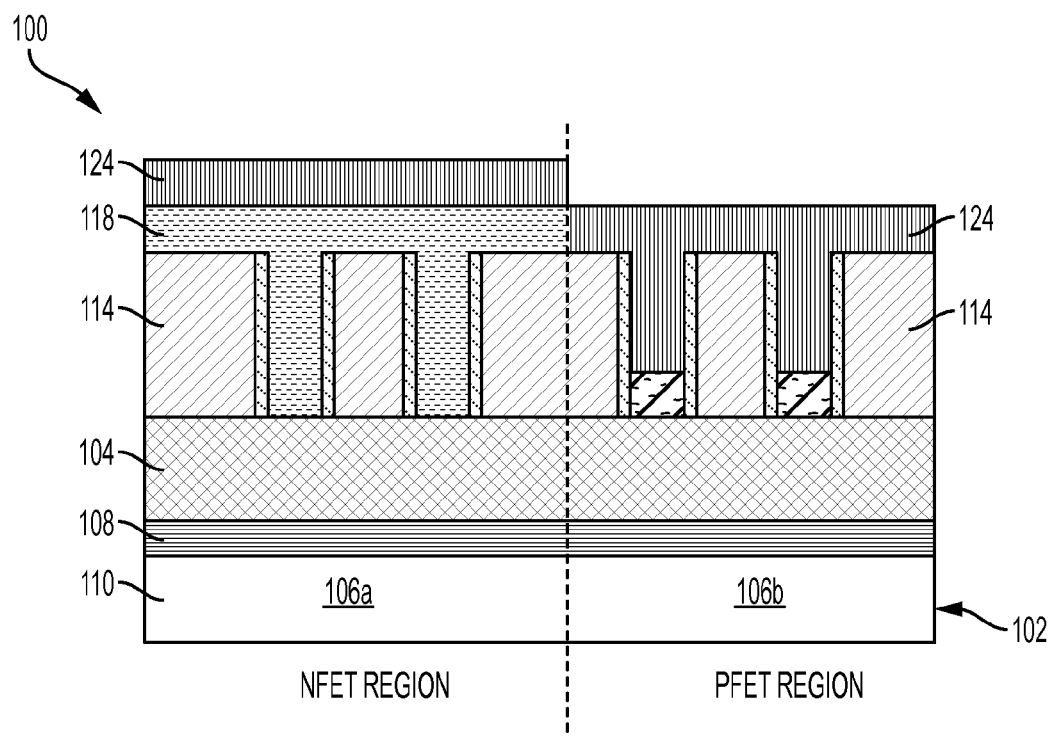

Referring to FIG. 8, the semiconductor device 100 is shown following deposition of a second hardmask layer 124 that covers the first hardmask layer 118 located in the NFET region. With respect to the PFET region 106b, the second hardmask 124 covers the dielectric layer 114 and fills the voids to cover the first conductive material 122a. The second hardmask layer 124 can be deposited using a similar process used to deposing the first hardmask layer 118. For instance, a CVD process may be performed to deposit a hardmask material so as to form the hardmask layer 124. According to a non-limiting embodiment, the material of the hardmask layer 124 is formed from TiN, for example, and matches the material of the first hardmask layer 118. As described above, the material differential between the combined first hardmask layer 118/second hardmask layer 124 and the conformal spacer layer 116 makes it possible to selectively etch the hardmask layers 118/124 with respect to the conformal spacer layer 116 as discussed in greater detail below.

Figure 9:
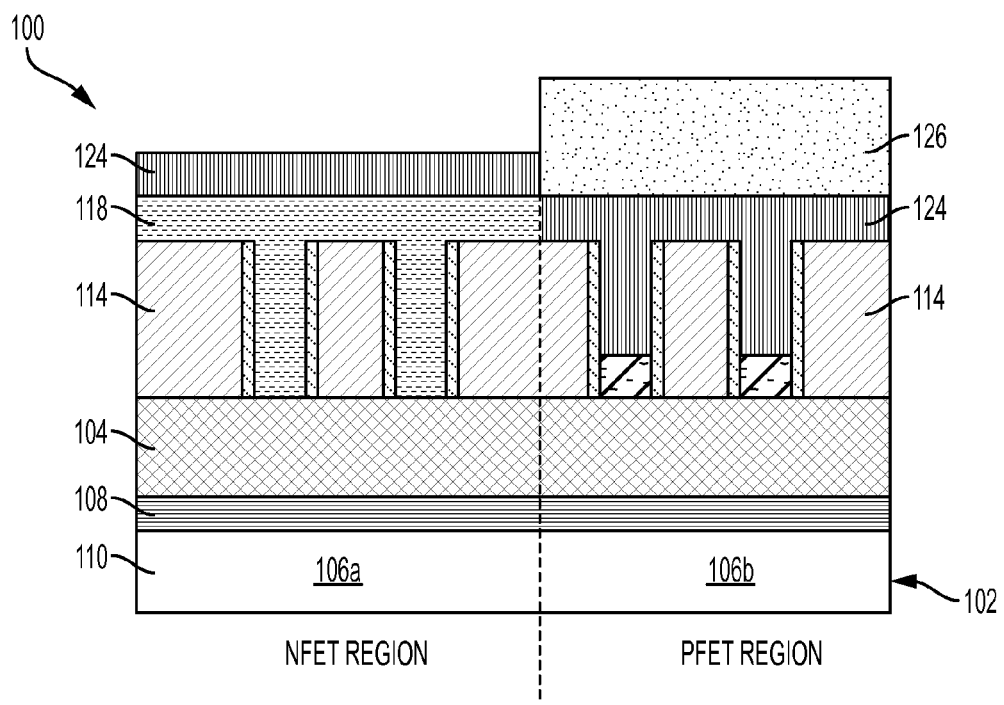

Turning to FIG. 9, the semiconductor device 100 is illustrated following deposition and patterning of a second photoresist layer 126. Accordingly, the resulting photoresist layer 126 is formed on the upper surface of the hardmask layer 124 in the PFET region 106b, while the upper surface of the hard mask layer 124 is exposed in the NFET region 106a. More specifically, the second photoresist layer 126 is initially deposited completely on the upper surface of the second hardmask layer 124 in both the NFET region 106a and the PFET region 106b. Thereafter, a patterned mask (not shown) is disposed above the second photoresist layer 126. The mask has a pattern that covers a portion of the second hardmask layer 126 located in the PFET region 106b and exposes a portion of the second hardmask layer 126 located in the NFET region 106a. A lithography process is then performed that exposes the device 100 to UV light, for example. The photoresist material reacts with the UV light such that the pattern defined by the mask is transferred into the exposed portion of the second photoresist layer 126. In this manner, a portion of the second hardmask layer 124 located in the NFET region 106a is exposed while a portion of the second hardmask layer 124 located in the PFET region 106b remains covered by the non-patterned second photoresist layer 126 as illustrated in FIG. 10.

Figure 10:
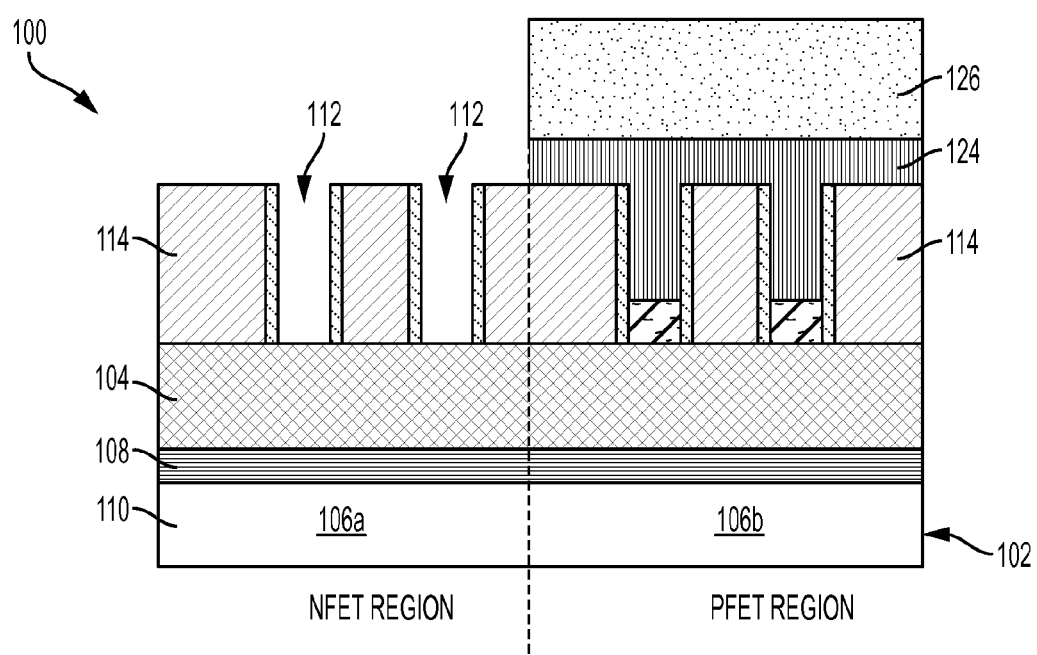

Turning now to FIG. 10, the hardmask layers 118/124 are removed from the spacer layer and the fin located in the NFET region 106a. The contact trenches 112 formed in the dielectric layer 114 are again revealed which re-exposes a portion of the semiconductor fin 104 located in the NFET region 106a. A directional etch such as a RIE process, for example, that is selective to the dielectric layer 114, the conformal spacer material 116, and the fin 104 may be used to selectively remove the hardmask layers 118/124. Following the directional etch process, the second hardmask layer 124 located in the PFET region 106b is maintained since it is covered by the remaining second photoresist layer 126 as further illustrated in FIG. 10.

Figure 11:
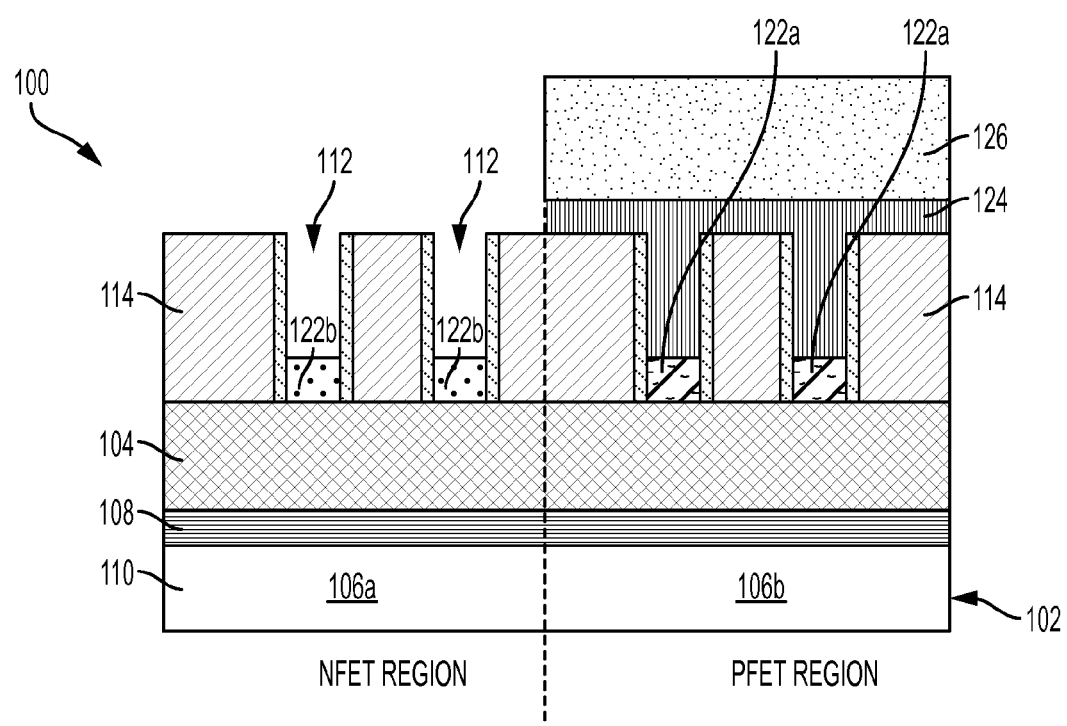

Referring to FIG. 11, the semiconductor device 100 is shown following removal of the remaining second photoresist layer (indicated in FIG. 11 as element 126) and after partially filling the contact trenches 112 with a second conductive material 122b. The second conductive material 122b may be formed according to an epitaxial growth process to grow an undoped or highly-conductive material, such as Si or SiGe, for example, from surfaces of the fin 104 exposed by the contact trenches 112. The epitaxy process used to grow the second conductive material 122b may be carried out using vapor phase epitaxy (VPE), molecular beam epitaxy (MBE) or liquid phase epitaxy (LPE) with a gaseous or liquid precursor, such as, for example, silicon tetrachloride.

According to a non-limiting embodiment, the second conductive material 122b is in-situ doped with boron (B), for example, to increase the conductivity of the first conductive material 122b. According to another option, the second conductive material 122b can be implanted with boron (B) ions, for example, using an ion-implantation process that is performed after the epitaxial growth process. In either case, an anneal process (not shown) can be performed to activate the dopants within the second conductive material 122b.

Figure 12:
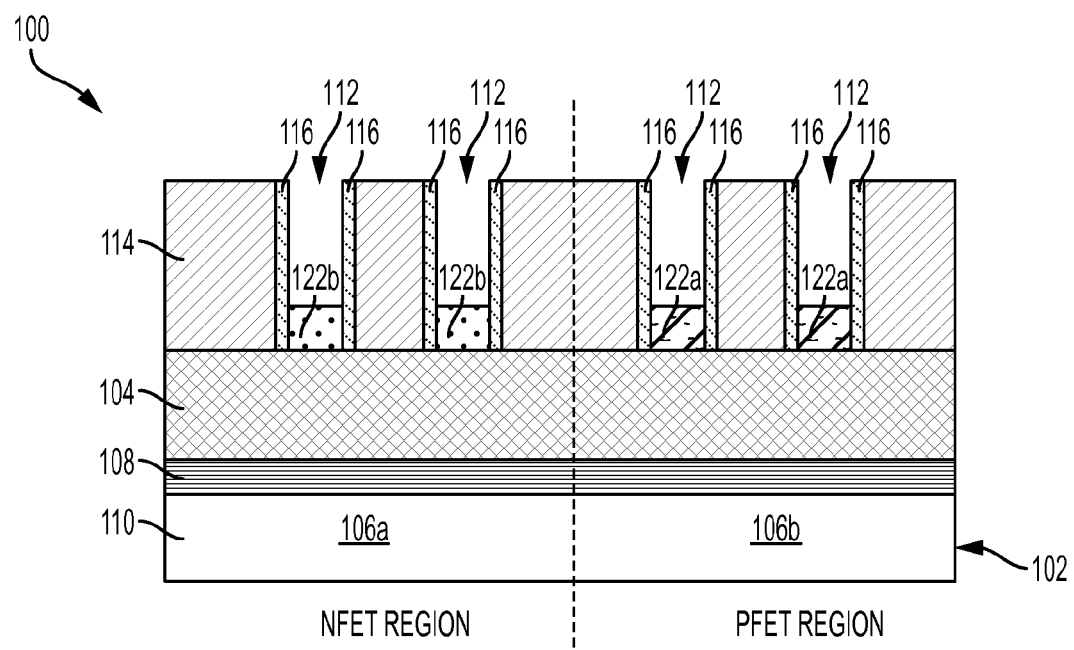

Turning to FIG. 12, the semiconductor device 100 is shown after removing the second photoresist layer 136 and the second hardmask layer 124 from atop the dielectric layer 114 located in the PFET region 106b. In this manner, the contact trenches 112 formed in the dielectric layer 114 are again revealed which re-exposes the first conductive material 122a. At this stage of the process flow, both the first and second conductive material 122a-122b located in the PFET region 106b and the NFET region 106a respectively, are exposed as further illustrated in FIG. 12.

Figure 13:
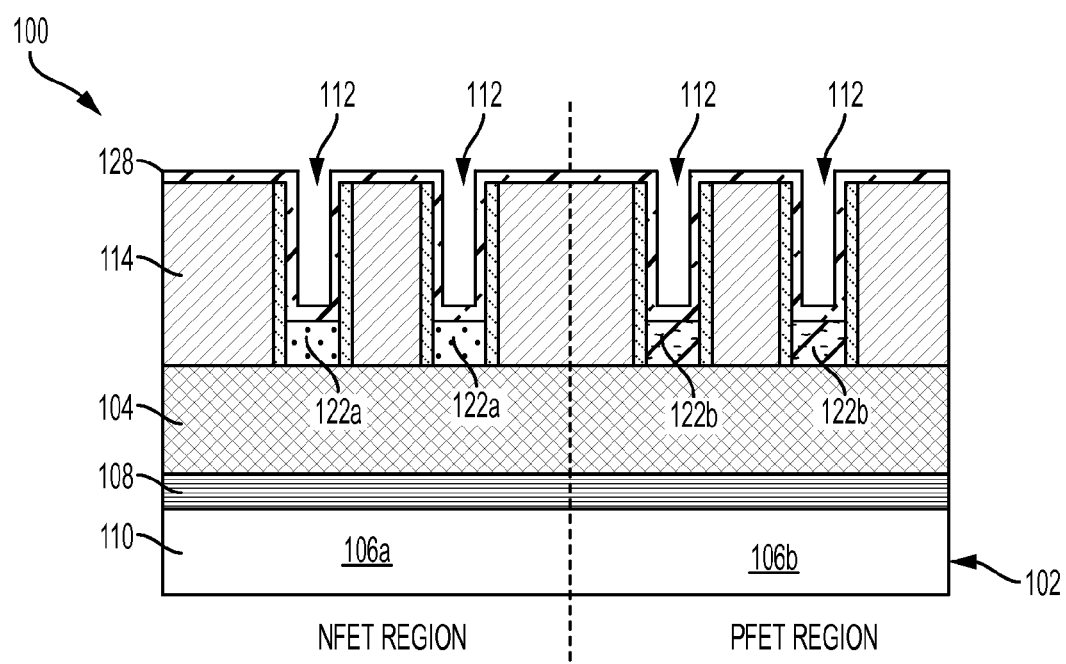

Referring now to FIG. 13, the semiconductor device 100 is shown following deposition of a contact liner 128 on an upper surface of the dielectric layer 114 located in both the NFET region 106a and the PFET region 106b. The contact liner 128 conforms to sidewalls of dielectric material 114 defined by the contact trenches 112 and the upper surface of the first and second conductive materials 122a-122b. The contact liner 128 serves to improve surface adhesion of the nitride spacers 116 and the conductive material 122a-122b with source/drain contact stacks (not shown in FIG. 13) subsequently formed in the contact trenches 112 as discussed in greater detail below. In addition, the contact liner 128 can also function as a diffusion barrier layer as understood by one of ordinary skill in the art.

The contact liner 128 can be formed as a single-layer liner or a dual-layer liner, and can be deposited using various material deposition techniques including, for example, CVD. The contact liner 128 has a thickness ranging from approximately 2 nm to approximately 20 nm, most preferably 4 nm, and conforms to the spacer sidewalls and the upper surface of the conductive material 122a-122b thereby decreasing the width of the source/drain trenches. When formed as a single-layer liner, the contact liner 128 may be formed from a conductive material such as, for example, titanium (Ti). When formed from a dual-layer liner, the contact liner 128 may comprise a combination of Ti and TiN.

Figure 14:
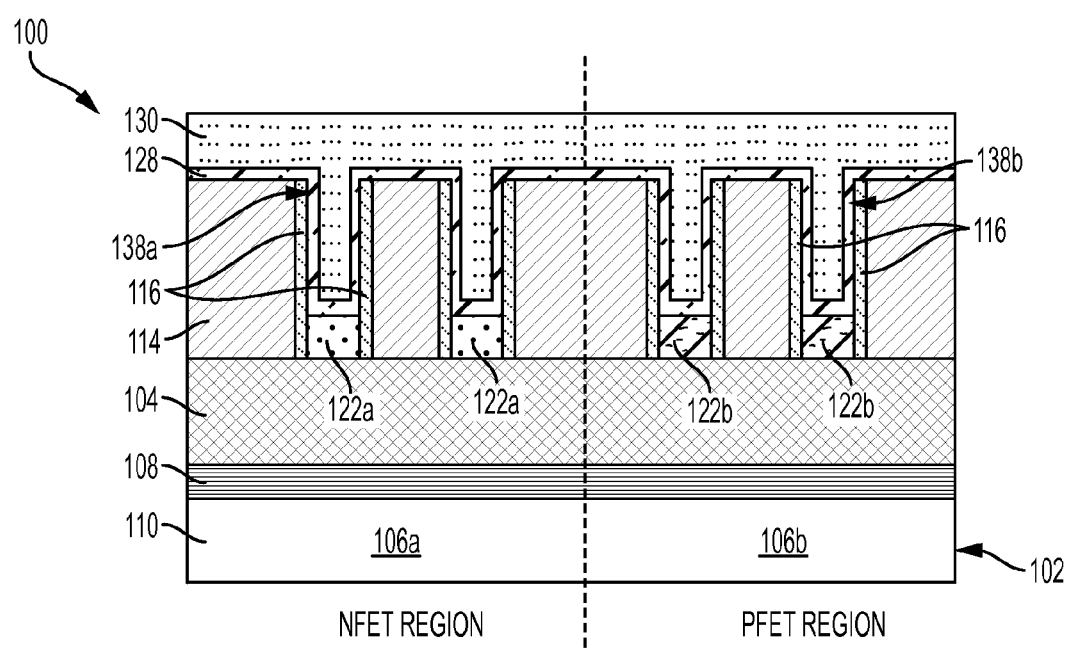

Turning to FIG. 14, a bulk conductive contact material 130 is deposited on an upper surface of the contact liner 128 to fill the contact trenches 112 in both the NFET region 106a and the PFET region 106b. According to a non-limiting embodiment, the bulk metal contact material 130 is deposited according to a CVD process. As described above, the contact liner 128 improves the adhesion of the metal contact material 130, especially within the area previously defined by the contact trenches 112. The metal contact material is formed from various materials including, but not limited to, tungsten (W). The use of tungsten, for example, maintains low source/drain contact resistance while still allowing the semiconductor device 100 to be scaled to at least 2× nm dimensions.

Figure 15:
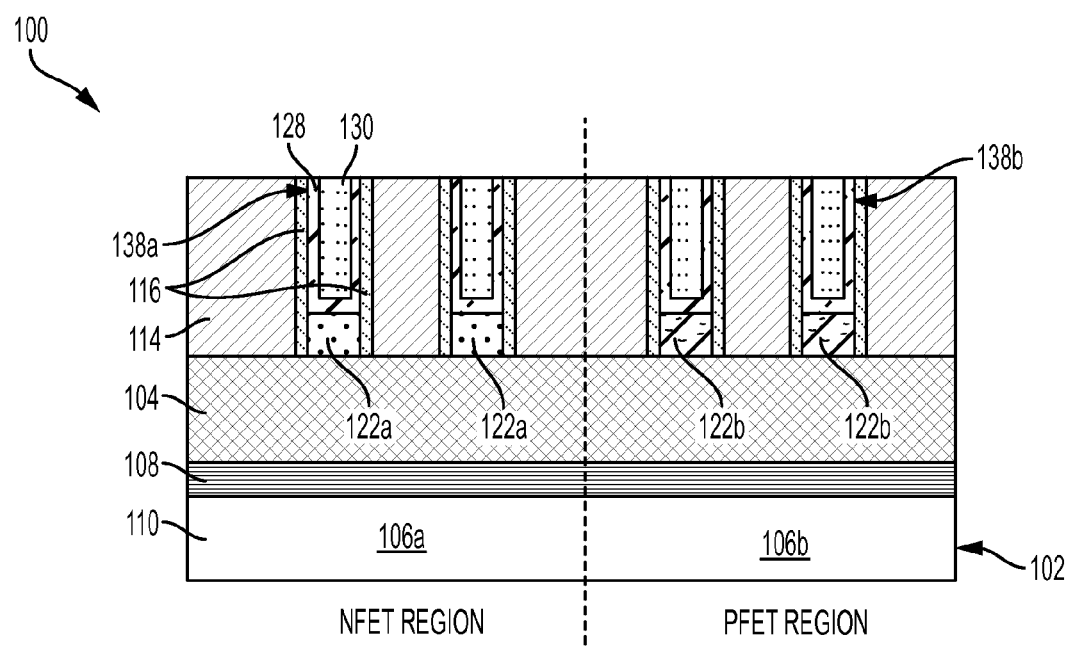

Referring to FIG. 15, the bulk metal contact material 130 is planarized according to a chemical-mechanical planarization (CMP) process. The CMP process may be stopped once reaching the underlying dielectric layer 114. Accordingly, portions of the contact liner 128 and the bulk metal contact material 130 are removed from the upper surface of the dielectrically layer 114. In this manner, the remaining metal contact material 130 forms metal contact plugs 130 having an upper surface that is flush with the upper surface of the dielectric material 114 as further illustrated in FIG. 15.

Figure 16:
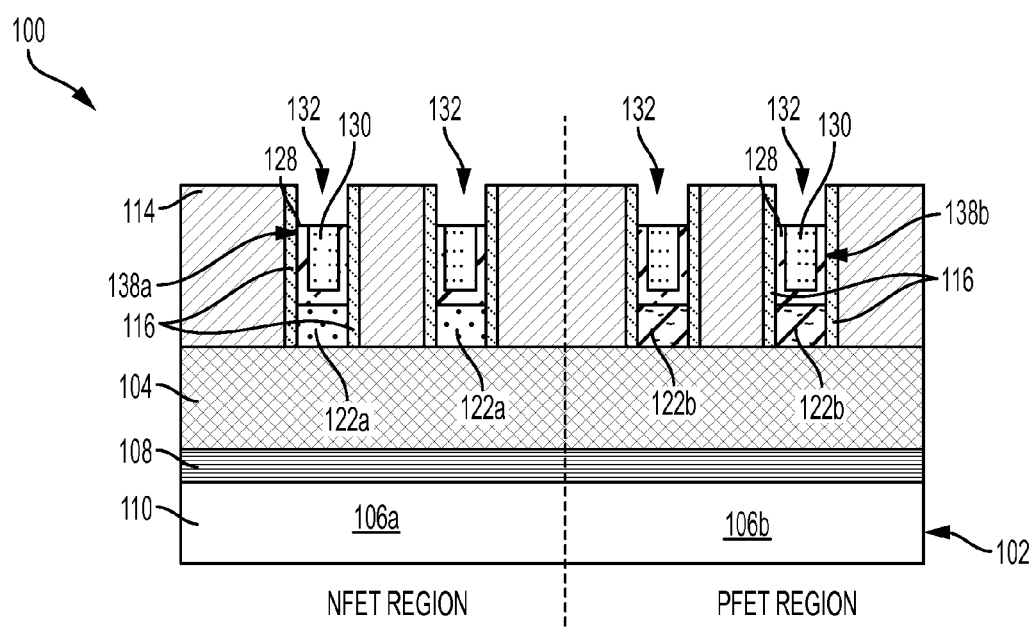

Turning to FIG. 16, an etching process such as a reactive ion etch (RIE), for example, is preformed that is selective to the metal materials of the contact liner 128 and the metal contact plugs 130. Accordingly, portions of the contact liner 128 and the metal contact plugs 130 are recessed with respect to the dielectric layer 114 and the spacer layers 116. In this manner, gaps 132 are formed between the spacer layers 116 in the NFET region 106a and the PFET region 106b.

Figure 17:
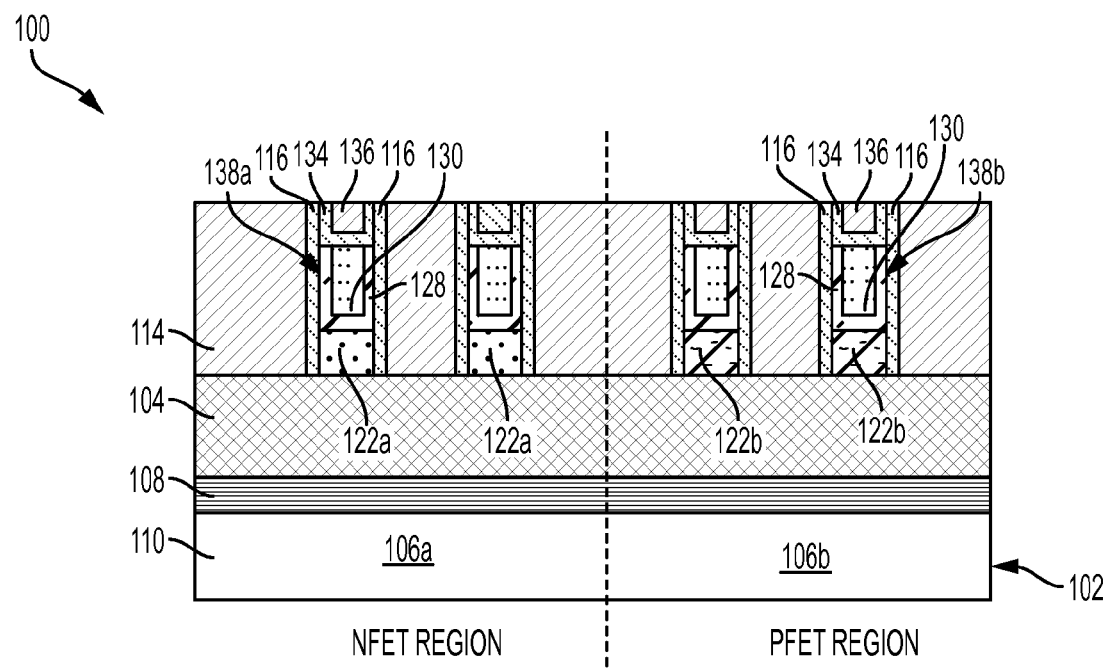

With reference now to FIG. 17, the semiconductor device 100 is shown after forming a cap spacer 134 and a dielectric cap 136 in each gap 132. More specifically, the cap spacer 134 comprises a nitride material such as SiN, for example, and is first deposited in the gap 132 using, for example, a CVD process. The cap spacers 134 conform to the sidewalls of the initial spacer layer 116, and also the upper surfaces of the contact liner 128 and the metal contact plugs 130. According to a non-limiting embodiment, the cap spacers 134 will form a shape that defines a smaller cavity between inner sidewalls of the cap spacers 134. In this case, the cavity can be filled with a dielectric material using a CVD process, for example, to form the dielectric cap 136. Accordingly, a side portion of the cap spacers 134 is interposed between the dielectric cap 136 and the spacer 116 included with a respective source/drain contact structure 138a-138b.

As further illustrated in FIG. 17, one or more NFET S/D contact stacks 138a are formed between the spacer layers 116 located in the NFET region 106a and one or more PFET S/D contact stacks 138b are formed between the spacer layers 116 located in the PFET region 106b as further illustrated in FIG. 17. It should be appreciated that an additional CMP process can be performed to planarize the upper surface of the semiconductor device 100 such that the S/D contact stacks 138a-138b are flush with the upper surface of the spacer layers 116 and the dielectric layer 114.

Figure 18:
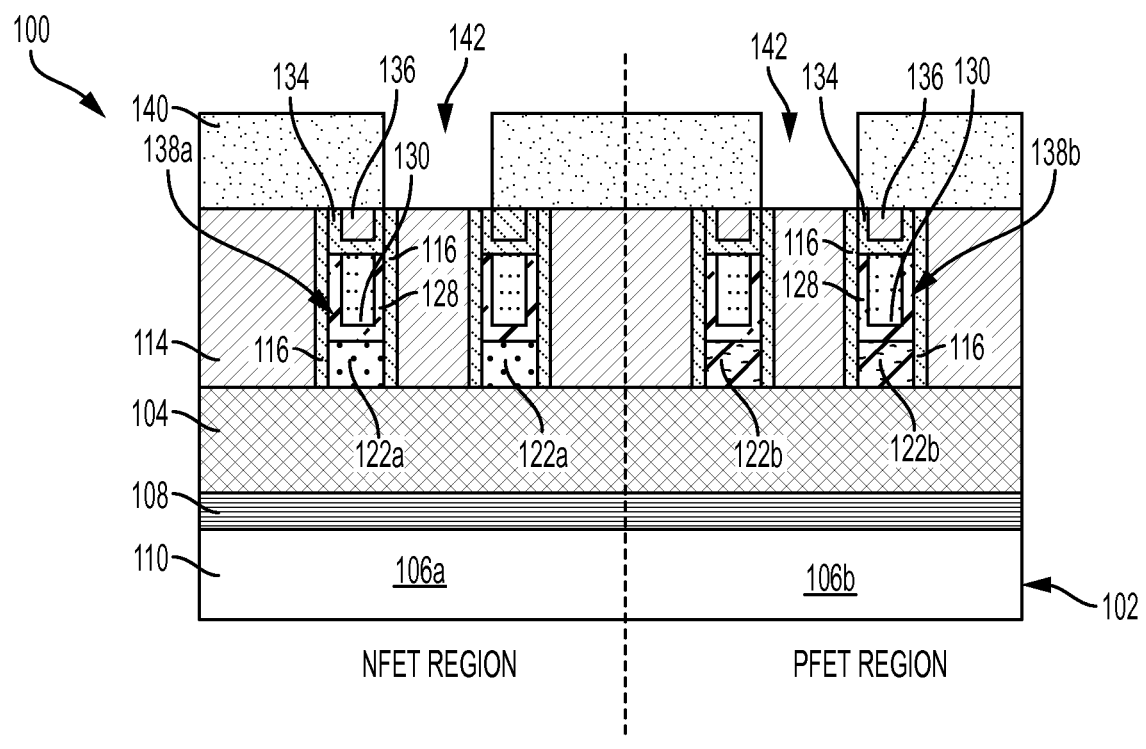

Referring to FIG. 18, a photoresist layer 140 is deposited on an upper surface of the dielectric layer 114 and covers the NFET contact stack 138a and the PFET contact stack 138b. The photoresist layer 140 is subsequently patterned to form voids 142 that expose portions of the dielectric layer 114 located between the spacer layers 116. The patterned voids 142 can be formed using a lithography process the employs a combination of masks and UV exposure as described in detail above. The exposed portions of the dielectric layer 114 designate locations reserved for forming a gate stacks (not shown in FIG. 18) between the NFET contact stacks 138a and the PFET contact stacks 138b.

Figure 19:
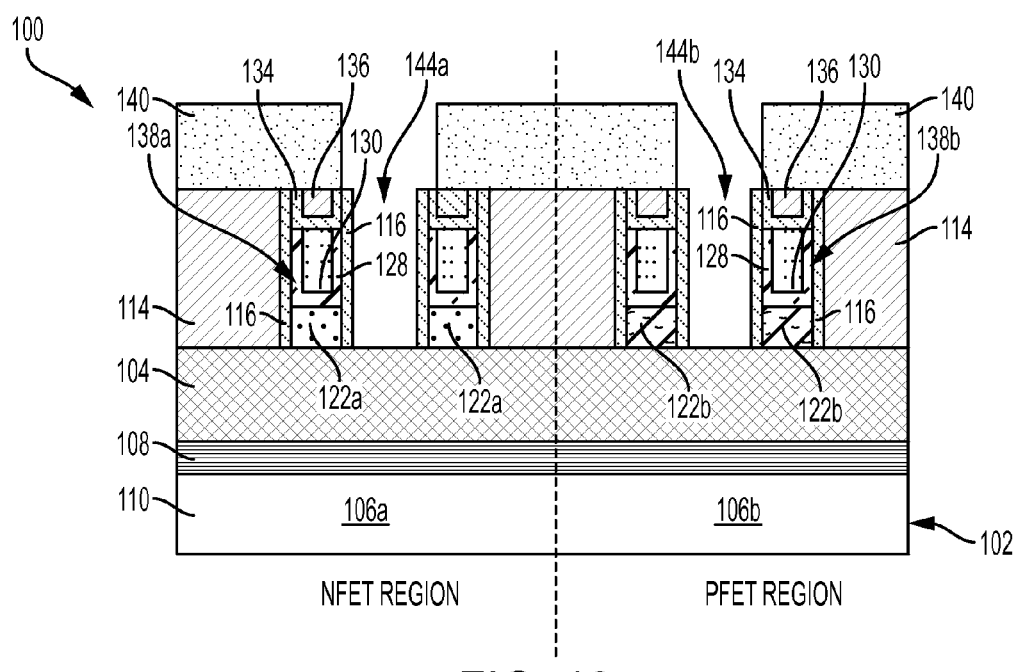
Figure 20:
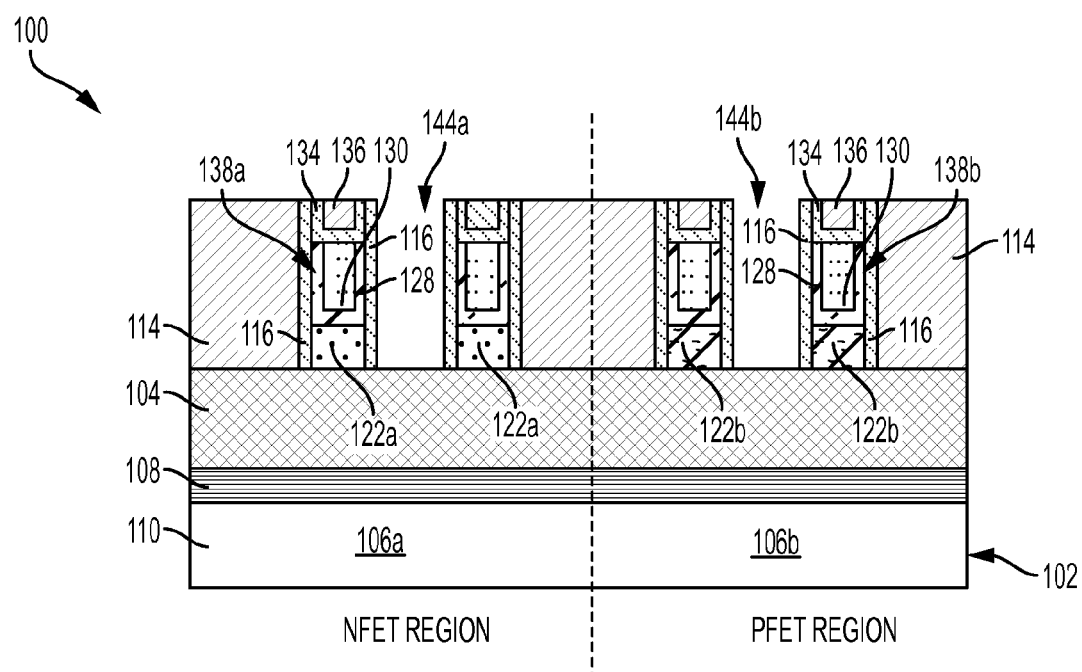

Turning to FIG. 19, the semiconductor device 100 is illustrated following a directional etching process, such as a RIE for example, which is selective to the material of the dialectic layer 114. The directional etch stops on an upper surface of the fin 104 such that a first gate trench 144a is formed between the NFET contact stacks 138a and a second gate trench 144b is formed between the PFET contact stacks 138b. Following formation of the gate trenches 144a-144b, the remaining photoresist layer 140 is removed as illustrated in FIG. 20.

Figure 21:
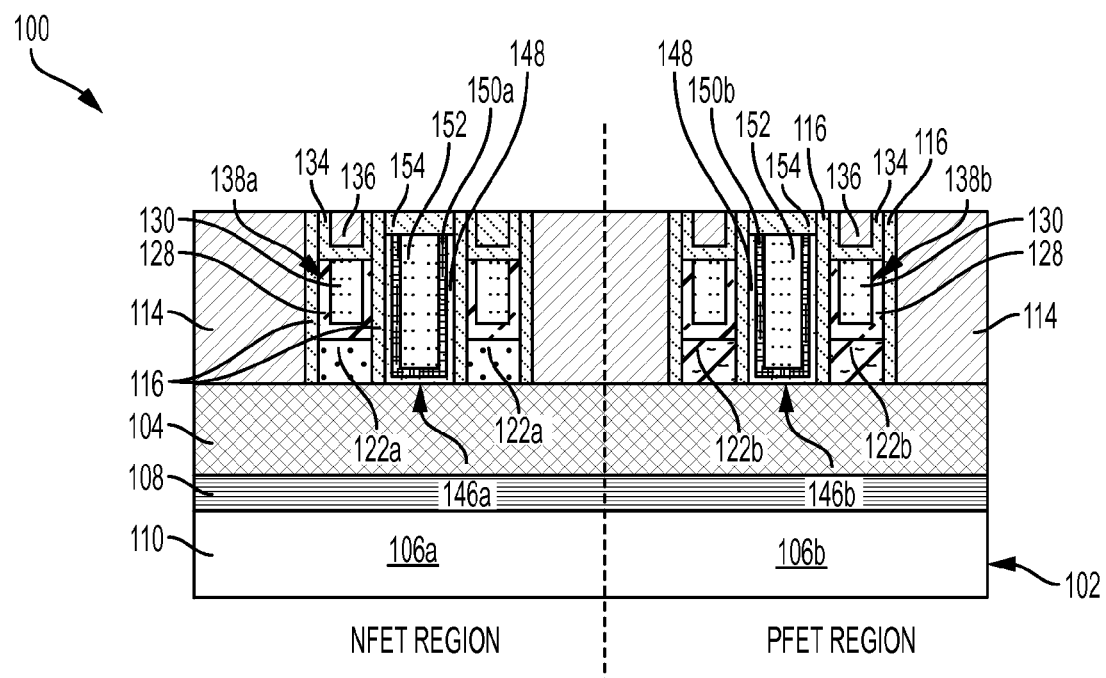

With reference now to FIG. 21, a completed semiconductor device is illustrated after forming self-aligned gate stacks 146a-146b in the gate trenches 144a-144b of the NFET and PFET regions 106a-106b, respectively. More specifically, a conformal gate insulation layer 148 is first deposited in the gate trenches 144a-144b using various deposition techniques such as, for example, CVD. The gate insulation layer 148 is formed from a high-k material including, but not limited to, hafnium oxide ($HfO_2$), and has a thickness ranging, for example, from approximately 1 nm to approximately 10 nm, preferably 2 nm.

As further illustrated in FIG. 21, various masking techniques (not shown) can be employed so as to selectively line the gate insulation layer 148 with one or more work function metal layers 150a-150b. For instance, the PFET region 106b may be blocked off while an NFET work function metal layer 150a is deposited in the gate trenches (previously indicated as numeral 144a) located in the NFET region 106a to line the inner surface of the gate insulation layer 148. The NFET work function metal layer 150a may be formed of TiN, for example, or any type of work function metals or work metal function combinations typically implemented to tune the threshold voltage of NFET devices. According to a non-limiting embodiment, the NFET work function metal layer 150a has a thickness ranging, for example, from approximately 2 nm to approximately 10 nm, preferably 4 nm. After depositing the NFET work function metal layer 150a, the NFET region 106a can be covered by a mask while a PFET work function metal layer 150b is deposited in the gate trenches (previously indicated as reference numeral 144b) located in the PFET region 106b to line the inner surface of the gate insulation layer 148. The PFET work function metal layer 150b may be formed as a combination of TiN and titanium carbide (TiC), for example, or any type of work function metals or work metal function combinations typically implemented to tune the threshold voltage of PFET devices. According to a non-limiting embodiment, the PFET work function metal layer 150a has a thickness ranging, for example, from approximately 2 nm to approximately 10 nm, preferably 4 nm.

Any masks used to form the work function metal layers 150a-150b can be stripped after completing the work metal function layer deposition processes discussed above, and a gate metal contact deposition process can be subsequently performed as further illustrated in FIG. 21. For instance, a bulk metal gate material 152 such as tungsten (W), for example, can be deposited on an upper surface of the dielectric layer 114 so as to fill the remaining area of the gate trenches. The process flow may be completed upon completion of a planarization process such as a CMP process, for example, which forms metal gate plugs 152 that serve as metal gate contacts of the semiconductor device 100. Accordingly, it should be appreciated that each metal gate stack 146a-146b formed in a respective gate trenches includes the gate insulation layer 148, the work function metal layers 150a/150b, and the metal gate plug 152. A gate cap 154 can be deposited on the upper surface of the metal gate stack 146a-146b to form a completed CMOS device having self-aligned source/drain contacts and improved spacer topology as illustrated in FIG. 21.

As described above, various non-limiting embodiments provide a semiconductor device including one or more self-aligned gate structures with an improved gate spacer topology. According to at least one embodiment, source/drain (S/D) contact structures including sidewall spacers are formed after forming the contact trenches which serve to contain the metal contact stacks of the device. The spacers are therefore exposed to a reduced number of etchings processes during the device fabrication process. In this manner, a semiconductor device is provided which includes gate spacers having an improved topology compared to conventional semiconductor devices.

In addition, a semiconductor device is provided which includes at least one pair of opposing source/drain contact structures formed on the upper surface of the semiconductor fin. Each source/drain contact structure includes a metal contact stack atop the upper surface of the at least one fin, and spacer interposed between a contact sidewall of the metal contact stack and a gate sidewall of the at least one metal gate stack. A cap spacer is formed on an upper surface of the metal contact stack and has a cap portion disposed against the spacer. In this manner, the metal gate stack is interposed between the opposing source/drain contact structures, and the metal contact stack may comprise a tungsten contact material. Accordingly, a resistance of the metal contact stacks can be reduced while still decreasing the overall scaling of the semiconductor device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor device, the method comprising:
    forming at least one semiconductor fin on an upper surface of a semiconductor substrate, and forming a dielectric layer having at least one sacrificial dielectric portion on an upper surface of the at least one semiconductor fin;
    forming a first source/drain metal contact stack adjacent a first side of the sacrificial dielectric portion and a second source/drain metal contact stack adjacent a second side of the sacrificial dielectric portion; and
    after forming the first and second source/drain metal contact stacks, replacing the sacrificial dielectric portion with a metal gate stack formed between opposing spacers, the opposing spacers including a first spacer formed against a first inner sidewall of a first contact trench among an opposing pair of contact trenches, and a second spacer formed against a second inner wall of an opposing second contact trench among the opposing pair of contact trenches,
    wherein forming the first and second source/drain metal contact stacks comprises:
        epitaxially growing a conductive material from the upper surface of the at least one semiconductor fin so as to partially fill the first and second contact trenches;
        depositing a contact liner that conforms to the sidewalls of the first and second contact trenches and an upper surface of the conductive material to form a contact cavity;
        depositing a metal contact material in the contact cavity so as to fill the first and second contact trenches; and
        recessing both the contact liner and the metal contact material with respect to the first and second spacers so as to form a gap between the first and second metal contact stacks and an upper surface of the dielectric layer.

2. The method of claim 1, wherein forming the dielectric layer includes patterning the dielectric layer such that the at least one sacrificial dielectric portion is interposed between the opposing pair of contact trenches.

3. The method of claim 2, further comprising prior to forming the first and second source/drain contact stacks, forming spacers against inner sidewalls of the opposing contact trenches.

4. The method of claim 1, further comprising forming a dielectric cap atop the source/drain metal contact stacks so as to fill the gap.

5. The method of claim 4, wherein the metal contact material is tungsten (W).

6. A method of forming self-aligned source/drain contacts of a complementary metal oxide semiconductor (CMOS) device, the method comprising:
    forming at least one semiconductor fin on an upper surface of a semiconductor substrate;
    patterning a dielectric layer disposed atop the at least one semiconductor fin to form a first plurality of contact trenches that define a first sacrificial dielectric portion on a first region of the at least one semiconductor fin reserved for an NFET device, and a second plurality of contact trenches that define a second sacrificial dielectric portion on a second region of the at least one semiconductor fin reserved for a PFET device;
    depositing a conformal spacer layer that lines an upper surface of the dielectric layer and the surfaces of the first and second plurality of contact trenches;

selectively patterning a first portion of the conformal spacer layer located in the first region so as to form NFET spacers on sidewalls of the first plurality of contact trenches while preserving a second portion of the conformal spacer layer located in the second region;

selectively patterning the second portion of the conformal spacer layer located in the second region so as to form PFET spacers on sidewalls of the second plurality of contact trenches while preserving the NFET spacers;

forming NFET source/drain metal contact stacks between the NFET spacers formed in the first plurality of contact trenches and forming PFET source/drain metal contact stacks between the PFET spacers formed in the second plurality of contact trenches so as to form the self-aligned source/drain contacts, after forming the NFET and PFET metal contact stacks, replacing the first sacrificial dielectric portion with a first metal gate stack to form the NFET device, and replacing the second sacrificial dielectric portion with a second metal gate stack to form the PFET device, the first metal gate stack formed between opposing NFET spacers and the second metal gate stack formed between opposing PFET spacers, the opposing NFET spacers and opposing PFET spacers each including a first spacer formed against a first inner sidewall of a first contact trench among an opposing pair of contact trenches, and a second spacer formed against a second inner wall of an opposing second contact trench among the opposing pair of contact trenches, wherein forming the NFET and PFET source/drain metal contact stacks comprises:

epitaxially growing at least one conductive material from an upper surface of the at least one semiconductor fin so as to partially fill the first and second contact trenches;

depositing a contact liner that conforms to the sidewalls of the first and second contact trenches and an upper surface of the conductive material to form a contact cavity;

depositing a metal contact material in the contact cavity so as to fill the first and second contact trenches; and recessing both the contact liner and the metal contact material with respect to the first and second spacers so as to form a gap between the NFET and PFET metal contact stacks and the upper surface of the dielectric layer.

7. The method of claim 6, wherein forming the NFET source/drain metal contact stacks further comprises forming a first conductive material including a first dopant on the upper surface of the at least one semiconductor fin, and wherein forming the PFET source/drain metal contact stacks further comprises forming a second conductive material including a second dopant on the upper surface of the at least one semiconductor fin, the second dopant being different from the first dopant.

8. The method of claim 7, wherein forming the first conductive material includes epitaxially growing the first conductive material in-situ doped with the first dopant from the upper surface of the at least one semiconductor fin, and wherein forming the second conductive material includes epitaxially growing the second conductive material in-situ doped with the second dopant from the upper surface of the at least one semiconductor fin.

9. The method of claim 8, wherein forming the NFET source/drain metal contact stacks and the PFET source/drain metal contacts further comprises lining the NFET spacers with a contact liner and depositing a metal material atop the contact liner.

10. The method of claim 9, wherein the metal contact material is tungsten (W).

* * * * *